(12) United States Patent
Morohara et al.

(10) Patent No.: US 12,002,897 B2
(45) Date of Patent: Jun. 4, 2024

(54) INFRARED DETECTING DEVICE

(71) Applicant: Asahi Kasei Microdevices Corporation, Tokyo (JP)

(72) Inventors: Osamu Morohara, Tokyo (JP); Yoshiki Sakurai, Tokyo (JP); Hiromi Fujita, Tokyo (JP); Hirotaka Geka, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 18/331,173

(22) Filed: Jun. 8, 2023

(65) Prior Publication Data

US 2024/0113247 A1 Apr. 4, 2024

Related U.S. Application Data

(63) Continuation of application No. 17/195,859, filed on Mar. 9, 2021, now Pat. No. 11,715,808.

(30) Foreign Application Priority Data

Mar. 10, 2020 (JP) .................................. 2020-040600

(51) Int. Cl.
*H01L 31/109* (2006.01)
*G01J 5/08* (2022.01)
*H01L 31/0352* (2006.01)
*H01L 31/18* (2006.01)

(52) U.S. Cl.
CPC .......... *H01L 31/109* (2013.01); *G01J 5/0853* (2013.01); *H01L 31/035236* (2013.01); *H01L 31/1844* (2013.01)

(58) Field of Classification Search
CPC .......... H01L 31/109; H01L 31/035236; H01L 31/0352; H01L 31/1844; H01L 31/18; H01L 31/105; H01L 31/03046; G01J 5/0853; G01J 5/08; G01J 5/20
See application file for complete search history.

(56) References Cited

U.S. PATENT DOCUMENTS

| | | | | |
|---|---|---|---|---|
| 10,361,333 | B1* | 7/2019 | Rajavel | ............... H01L 31/1013 |
| 2007/0090337 | A1 | 4/2007 | Ueno et al. | |
| 2008/0073639 | A1* | 3/2008 | Hudait | ............... H01L 21/0251 |
| | | | | 257/E29.069 |
| 2009/0160033 | A1* | 6/2009 | Watanabe | ............... H01L 33/20 |
| | | | | 257/466 |
| 2011/0156097 | A1* | 6/2011 | Maimon | ............ H01L 31/03046 |
| | | | | 257/E31.05 |
| 2017/0244002 | A1* | 8/2017 | Campbell | ......... H01L 31/03046 |
| 2019/0267500 | A1* | 8/2019 | Morohara | ......... H01L 31/03046 |
| 2019/0355857 | A1* | 11/2019 | Fuyuki | ............. H01L 31/03046 |
| 2020/0028020 | A1 | 1/2020 | Sakurai et al. | |
| 2020/0072739 | A1* | 3/2020 | Sasayama | .............. G02B 5/285 |
| 2020/0219908 | A1* | 7/2020 | Minari | .............. H01L 27/14685 |
| 2021/0091185 | A1* | 3/2021 | Manfra | ................. H01L 29/778 |

FOREIGN PATENT DOCUMENTS

| | | |
|---|---|---|
| JP | 2019125776 A | 7/2019 |
| JP | 2019153770 A | 9/2019 |
| WO | 2005027228 A1 | 3/2005 |

OTHER PUBLICATIONS

B. Corbett et al., Surface recombination in dry etched AlGaAs/GaAs double heterostructure p-i-n mesa diodes, Applied Physics Letters, 1993, pp. 87-89, vol. 62, No. 1.

Omer Salihoglu et al., A Comparative Passivation Study for InAs/GaSb Pin Superlattice Photodetectors, IEEE Journal of Quantum Electronics, 2013, pp. 661-666, vol. 49, No. 8.

S. Park et al., Suppression of surface leakage current in InSb photodiode by ZnS passivation, International Journal of Nanotechnology, 2016, pp. 394-401, vol. 13, No. 4/5/6.

* cited by examiner

*Primary Examiner* — Calvin Y Choi
(74) *Attorney, Agent, or Firm* — KENJA IP LAW PC

(57) ABSTRACT

An infrared detecting device is provided. The infrared detecting device includes: a semiconductor substrate; a first layer having a first conductivity type on the semiconductor substrate; a light receiving layer on the first layer; and a second layer having a second conductivity type on the light receiving layer. A part of the first layer, the light receiving layer, and the second layer form a mesa structure. The second layer contains $Al_zIn_{1-z}Sb$ ($0.05<z<0.18$). The side surfaces and an upper surface of the mesa structure are covered with the protective layer. A part of an upper surface of the second layer that forms an interface between the second layer and the protective layer has an oxide layer made of a constituent material of the second layer. The oxide layer includes an oxide of Al and has no oxide of Sb.

8 Claims, 8 Drawing Sheets

INFRARED DETECTING DEVICE

CROSS-REFERENCE TO RELATED APPLICATIONS

The present application is a continuation application of U.S. patent application Ser. No. 17/195,859 filed Mar. 9, 2021, which claims priority to Japanese Patent Application No. 2020-040600 filed Mar. 10, 2020. The disclosures of the prior applications are hereby incorporated by reference herein in their entirety.

TECHNICAL FIELD

The present disclosure relates to infrared detecting devices.

BACKGROUND

Generally, infrared rays of a long wavelength band having a wavelength of 2 μm or more are used for human sensors for detecting human bodies, non-contact temperature sensors, gas sensors, and the like because of its thermal effect and the effect of infrared absorption by a gas. For example, gas sensors can be used, for example for monitoring and protecting the atmospheric environment, also for early fire detection and the like, and attract attention in recent years. In particular, there are many absorption bands inherent to individual gases in the wavelength range from 2.5 μm to 10.0 μm, which is a wavelength band suitable for use in gas sensors.

The principle of the gas sensors using infrared rays is as follows. For example, when a gas is introduced into the space between an infrared light source and an infrared detecting device, some type of gas absorbs infrared rays having a specific wavelength. Thus, by analyzing the wavelength spectrum before and after the introduction of the gas, the type and concentration of the gas can be determined. Here, the infrared detecting devices include, for example, thermal infrared detecting devices such as pyroelectric sensors and thermopiles, and quantum infrared detecting devices using semiconductor light receiving devices. Quantum infrared detecting devices have advantages such as a high SNR and a high-speed response compared with thermal infrared detecting devices.

A quantum infrared detecting device typically forms a PN junction in a semiconductor capable of detecting infrared rays having a wavelength of 2 μm or more, and electrons and holes generated by the absorbed infrared rays in a light receiving layer are converted into electric signals through charge separation by the internal electric field in a depletion layer at the PN junction.

However, the bandgap of a semiconductor capable of absorbing infrared rays having a wavelength of 2 μm or more is as small as 0.62 eV or less. In a semiconductor with such a small band gap, the intrinsic carrier density at room temperature is high due to thermally excited carriers and the electric resistance of devices is low, making it impossible to obtain sufficient PN diode characteristics. This is because when the intrinsic carrier density is high, leakage currents in the device such as a diffusion current and a dark current are high. Accordingly, infrared detecting devices provided with a cooling mechanism have been conventionally used for quantum infrared detecting devices in order to suppress thermally excited carriers.

Examples of an infrared detecting device that solves such a problem due to the influence of the ambient temperature include a quantum infrared detecting device disclosed in WO 2005027228 A (PTL 1). The quantum infrared detecting device disclosed in PTL 1 suppresses the diffusion current by the layered structure and the device structure of the compound semiconductor of the sensor portion, and improves the package of signal amplifier ICs and sensors, thereby providing an infrared detecting device which is operable at room temperature and smaller in size than conventional devices.

CITATION LIST

Patent Literature

PTL 1: WO 2005/027228 A

Non-Patent Literature

NPL 1: B. Corbett et al., "Surface recombination in dry etched AlGaAs/GaAs double heterostructure p-i-n mesa diodes" Applied Physics Letters, 62(1), 87(1993)

NPL 2: O. Salihoglu., "A comparative passivation study for InAs/GaSb pin superlattice photodetectors" Journal of Quantum Electronics, 49, 8 (2013)

NPL 3: S. Park et al., "Suppression of surface leakage current in InSb photodiode by ZnS passivation" International Journal of Nanotechnology, 13, 392 (2016)

SUMMARY

As described above, research and development for improving the characteristics of infrared detecting devices have been made, yet further improvement in signal noise ratio (SNR) characteristics is desired.

In view of these circumstances, it would be helpful to provide an infrared detecting device having a high SNR.

The present disclosure provides an infrared detecting device comprising: a semiconductor substrate; a first layer having a first conductivity type on the semiconductor substrate; a light receiving layer on the first layer; and a second layer having a second conductivity type on the light receiving layer, wherein a part of the first layer, the light receiving layer, and the second layer form a mesa structure, the light receiving layer contains $Al_xIn_{1-x}Sb$ (0.05<x<0.18), and at least a part of side surfaces of the mesa structure are covered with a protective layer, and part of the protective layer that is in contact with side surfaces of the light receiving layer is made of silicon nitride.

According to the present disclosure, it is possible to provide an infrared detecting device having a high SNR.

DETAILED DESCRIPTION

Figure 1:
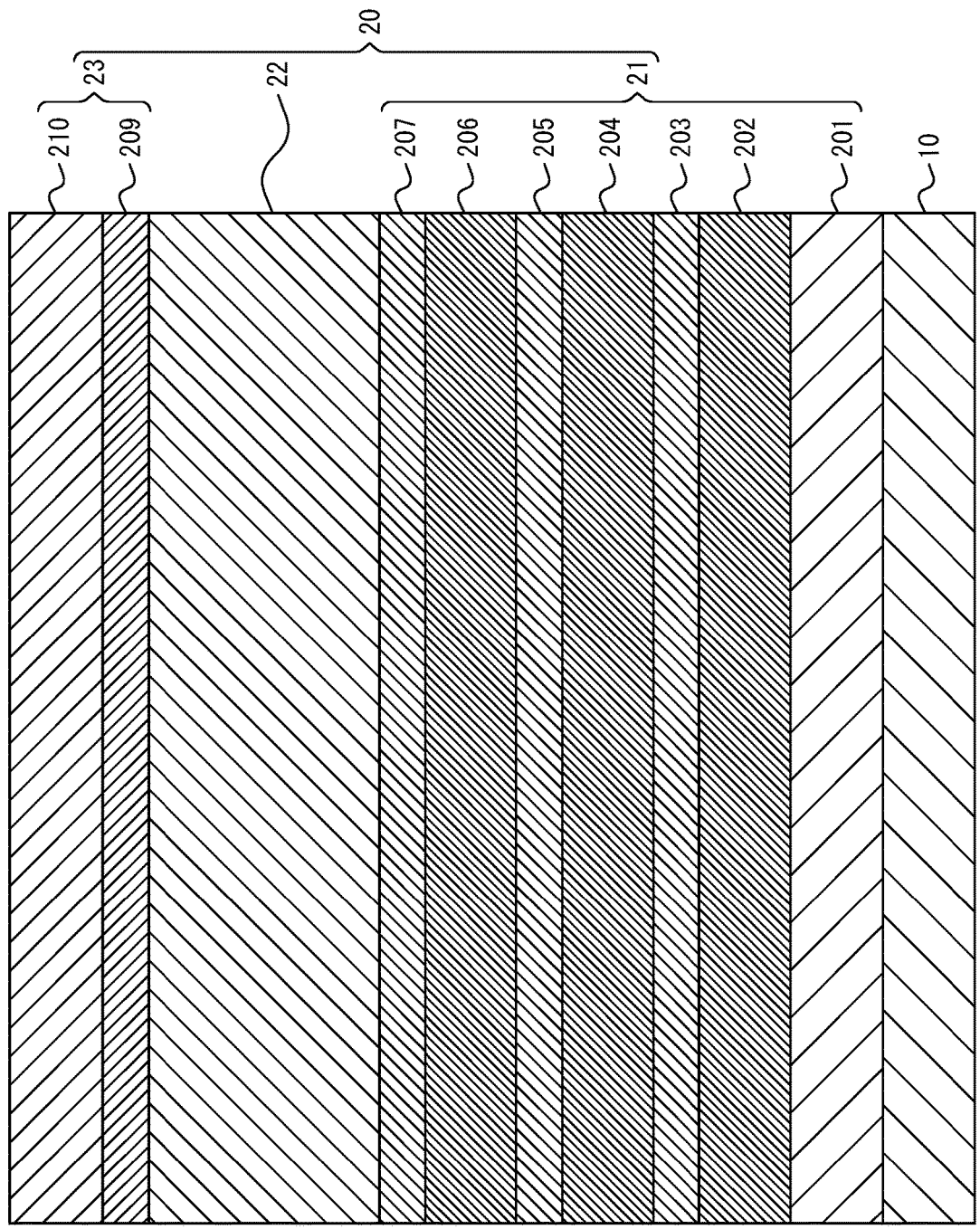
FIG. 1 is a cross-sectional view illustrating a configuration of a compound semiconductor layer forming an infrared detecting device according to a first embodiment.

Numerous specific configurations will be described in detail below in order to provide a thorough understanding of embodiments of the present disclosure. It will be apparent, however, that other embodiments may be implemented without being limited to the disclosed configurations. In addition, the following embodiments do not limit the aspects and concepts of the present disclosure defined by the claims, but include all of the combinations of characteristic configurations described in the embodiments.

<Infrared Detecting Device>

An infrared detecting device according to this embodiment includes: a semiconductor substrate; a first layer having a first conductivity type on the semiconductor substrate; a light receiving layer on the first layer; and a second layer having a second conductivity type on the light receiving layer. A part of the first layer, the light receiving layer, and the second layer form a mesa structure. The light receiving layer contains $Al_xIn_{1-x}Sb$ (0.05<x<0.18). At least a part of side surfaces of the mesa structure are covered with a protective layer, and part of the protective layer that is in contact with the side surface of the light receiving layer is made of silicon nitride.

Here, the SNR of the infrared detecting device is proportional to the product of a photocurrent $I_p$ generated upon incidence of an infrared ray and the square root of a device resistance $R_0$ of the infrared detecting device. That is, it is expressed as:

$$SNR \propto I_p \sqrt{R_0} \qquad \text{Expression (1)}$$

Accordingly, by increasing the device resistance $R_0$ without lowering $I_p$, it is possible to improve the SNR characteristics of the infrared detecting device.

A current flowing through a diode forming the infrared detecting device is divided into two parts: a current flowing inside the device and a current flowing along side surfaces of the device. The magnitude of each current can be determined, for example by producing a plurality of devices having different sizes of mesa shapes and determining the dependence of the current density on the device size and the perimeter of the device as described in B. Corbett et al., "Surface recombination in dry etched AlGaAs/GaAs double heterostructure p-i-n mesa diodes" Applied Physics Letters, 62(1), 87(1993) (NPL 1).

Similarly, the device resistance $R_0$ of the infrared detecting device is divided into two parts: a resistance component $R_d$ to the current flowing inside the device and a resistance component $R_S$ to the current flowing along the side surfaces of the device (see Expression (2)). Using the technique of NPL 1, when $1/(R_0 \cdot S)$ is plotted with respect to L/S according to Expression (3), from the intercept and the slope, the resistivity $R_a$ per unit area of the mesa shape for the current flowing inside the infrared detecting device and the resistivity α per unit length of the mesa shape for the current flowing along the side surfaces of the infrared detecting device.

$$\frac{1}{R_0} = \frac{1}{R_d} + \frac{1}{R_S} = \frac{1}{R_a}S + \frac{1}{\alpha}L \qquad \text{Expression (2)}$$

$$\frac{1}{R_0 \cdot S} = \frac{1}{R_a} + \frac{1}{\alpha} \cdot \frac{L}{S} \qquad \text{Expression (3)}$$

As described above, $R_0$ is a resistance of the infrared detecting device. Meanwhile, $R_d$ is a resistance component corresponding to the current flowing inside the infrared detecting device. Further, $R_S$ is a resistance component corresponding to the current flowing along the side surfaces of the infrared detecting device. Further, $R_a$ is a resistivity per unit area of the mesa shape for the current flowing inside the infrared detecting device. Further, α is a resistivity per unit length of the mesa shape for the current flowing along the side surfaces of the infrared detecting device. Here, S is the area of the mesa shape of the infrared detecting device. Meanwhile, L is the length of the mesa shape of the infrared detecting device.

As described above, by increasing the device resistance $R_0$, it is possible to improve the SNR characteristics of the infrared detecting device. As indicated by Expression (2), the amount of the device resistance $R_0$ (hereinafter, may also be simply referred to as $R_0$) is determined such that the lower of the two: the resistance component $R_d$ to the current flowing inside the infrared detecting device (hereinafter, may also be simply referred to as $R_d$) and the resistance component $R_S$ to the current flowing along the side surfaces of the infrared detecting device (hereinafter, may also be simply referred to as $R_S$) is predominant. Accordingly, when $R_d$ is relatively high and $R_S$ is relatively low, improving $R_S$ helps to increase $R_0$.

$R_d$ is determined by the resistivity $R_a$ per unit area of the mesa shape for the current flowing inside the infrared detecting device (hereinafter, may also be simply referred to as $R_a$). $R_a$ is determined by the magnitude of the recombination current of carriers in the light receiving layer when the diffusion current is sufficiently reduced.

$R_s$ is determined by the resistivity α per unit length of the mesa shape for the current flowing along the side surfaces of the infrared detecting device (hereinafter, may also be simply referred to as α). α is determined by the magnitude of the current flowing along the side surfaces of the infrared detecting device. An example of the current flowing along the side surfaces of the infrared detecting device is a recombination current caused by the defect levels formed on the side surfaces of the infrared detecting device. When the recombination current caused by the defect levels is predominant, reducing the defect levels on the side surfaces of the infrared detecting device increases α. The defect levels greatly depend on the kind of the protective layer that protects the side surfaces of the infrared detecting device.

Examples of the material of the protective layer protecting the side surfaces of the infrared detecting device include, for example, silicon oxide, silicon nitride, aluminum oxide, titanium oxide, zinc oxide, hafnium oxide, etc. given in O. Salihoglu., "A comparative passivation study for InAs/GaSb pin superlattice photodetectors" Journal of Quantum Electronics, 49, 8 (2013) (NPL 2). Combinations of the materials of the infrared detecting device and the material of the protective layer were studied in the past. For example, S. Park et al., "Suppression of surface leakage current in InSb photodiode by ZnS passivation" International Journal of Nanotechnology, 13, 392 (2016) (NPL 3) describes that when an InSb material is protected with silicon nitride, the defect level density is higher than the case of protection with silicon oxide. Therefore, according to common technical knowledge for those skilled in the art, silicon nitride was not preferred as a material of a protective layer for an InSb-based material.

With the infrared detecting device according to this embodiment, in which the light receiving layer contains $Al_xIn_{1-x}Sb$ (0.05<x<0.18) and the protective layer covering the side surfaces of the mesa shape is made of silicon nitride, and the resistivity α per unit length of the mesa shape can be improved in contrast to the common technical knowledge for those skilled in the art according to which silicon nitride is not preferred as a protective layer.

As used herein, although "on" in the term "a first layer that is formed on the semiconductor substrate and has a first conductivity type" indicates that the first layer is formed on the semiconductor substrate, this term also includes cases where another layer is also present between the semiconductor substrate and the first layer. The term "on" used in describing the relationship between other layers shall also be interpreted as defined above.

As used herein, "containing" in the term "containing $Al_xIn_{1-x}Sb$" indicates that a layer mainly contains Al, In, and Sb, yet this term also includes cases where the layer additionally contains other elements. Specifically, this term also includes cases where a slight change is made to the composition of this layer by adding a small amount of other elements (for example, by adding an element such as As, P, Ga, or N by not more than several percent). The term "containing" used to describe the composition of other layers shall be interpreted as defined above.

Components of the infrared detecting device according to this embodiment will now be described by way of example.

<Semiconductor Substrate>

The semiconductor substrate of the infrared detecting device according to this embodiment is not particularly limited as long as a first layer to be described later can be stacked thereon. Examples of the semiconductor substrate include, but are not limited to, a GaAs substrate, a Si substrate, an InP substrate, and an InSb substrate. From the viewpoint that crystal growth of a compound semiconductor is easy, a GaAs substrate is preferable.

The semiconductor substrate is not limited to being doped with a donor impurity or an acceptor impurity. However, from the viewpoint of enabling a plurality of independent infrared detecting devices formed on the conductor substrate to be connected in series or in parallel, the semiconductor substrate is desirably semi-insulating or capable of being isolated from compound semiconductor layers.

From the viewpoint of stacking a compound semiconductor single crystal, the semiconductor substrate is preferably a single crystal substrate. The plane orientation of the semiconductor substrate is not particularly limited, yet for example (001), (111), (101), etc. are desirable. It is also preferable to use a plane orientation inclined by 1° to 5° with respect to these plane orientations.

The surface of the semiconductor substrate may be heated in a vacuum to remove an oxide film, and the semiconductor substrate may be subjected to a cleaning treatment with an acid or an alkali after contaminants such as organic substances and metals are removed.

(Method of Measuring Al Composition of Each Layer)

The Al composition of each layer was obtained as follows by secondary ion mass spectrometry (SIMS). For the measurement, a magnetic field type SIMS system IMS 7f manufactured by CAMECA was used. In this method, compositional analysis is performed by irradiating a solid surface with a beam of primary ion species to cause the sputtering phenomenon by which the surface is dug in the depth direction, and simultaneously detecting secondary ions generated by the sputtering phenomenon. As used herein, the Al composition refers to the ratio of Al to all the group XIII elements contained in each layer.

Specifically, cesium ions ($Cs^+$) were used as the primary ion species, the primary ion energy was set to 2.5 keV, and the beam incident angle was set to 67.2°. Under these conditions, $MCs^+$ (M was Al, Ga, In, As, Sb, or the like) with a small matrix effect was detected as the secondary ion species to be detected.

At this time, sputtering was carried out under the above-mentioned conditions and up to the intended depth of the target layer for a predetermined period of time to analyze the composition of the target layer. The depth of the target layer can be obtained from the thickness of each layer by cross-sectional TEM measurement as described later. The sputtering depth in SIMS analysis was calculated in such a manner that the sputtering depth in a certain period of time under the same condition as the analysis was measured using, for example, a stylus profilometer to obtain the sputtering rate, and the sputtering time in the measurement on each sample was converted into depth using the sputtering rate.

Subsequently, from the signal intensity of MCs+ in each layer, the Al composition was obtained. For example, in the case of an AlInSb layer, the Al composition was obtained from: (signal intensity of $AlCs^+$)/((signal intensity of $AlCs^+$)+(signal intensity of $InCs^+$)).

Here, although the layers have a uniform composition in the depth direction, the signal intensity sometimes varies in the depth direction due to the influence of sputtering. In this case, the signal intensity of each layer is represented by the maximum signal intensity.

The quantitative value of the Al composition obtained by the analysis may be different from the true value. In order to offset this difference from the true value, a separate sample for which the lattice constant value found by X-ray diffractometry (XRD) has been determined was prepared, and, using this sample as a reference sample whose Al composition value was already known, SIMS analysis was performed under the measurement conditions for the Al composition of each layer included in the first layer, and the sensitivity coefficient of the Al composition with respect to the signal intensity was obtained. The Al composition of each layer included in the first layer was obtained by multiplying the SIMS signal intensity in each layer included in the first layer by the sensitivity coefficient.

In this case, as the separate sample, $Al_xIn_{1-x}Sb$ having a film thickness of 800 nm stacked on a GaAs substrate was used. For this sample, a lattice constant was obtained by an X-ray diffractometry (XRD) using an X-ray diffractometer X'Pert MPD available from Spectris Co., Ltd., as described below to determine the Al composition x as a reference sample.

By performing 2θ-ω X-ray diffraction scans, the lattice constant in the direction normal to the substrate surface of the layer containing $Al_xIn_{1-x}Sb$ was obtained from the peak position in the 2θ-ω scan of the plane index of the plane corresponding to the plane orientation of the substrate surface, and the Al composition x was determined from the lattice constant in the normal direction using the Vegard's law. In this case, it was assumed that there was no anisotropic distortion of the $Al_xIn_{1-x}Sb$ layer. Specifically, the Vegard's law is represented by:

$$a_{AlInSb} = xa_{AlSb} + (1-x)a_{InSb} \qquad \text{Expression (4).}$$

In the expression, $a_{AlSb}$ is the lattice constant of AlSb; $a_{InSb}$ is the lattice constant of InSb; and $a_{AlInSb}$ is the lattice constant of $Al_xIn_{1-x}Sb$ obtained by the above-described X-ray diffraction. For $a_{AlSb}$, 6.1355 angstroms was used, and for $a_{InSb}$, 6.4794 angstroms was used. As a reference sample for SIMS measurement, a sample with 0.10<x<0.15 was used.

The composition of elements other than Al in each layer included the first layer can also be measured by using the same method as described above.

(Method of Measuring Film Thickness of Each Layer)

The film thickness of each layer can be measured by cross-sectional transmission electron spectroscopy (TEM). Specifically, a sample having a thickness of about 500 nm or less was prepared by FIB sampling using an FIB system (FB-2100) manufactured by Hitachi High-Technologies Corporation, sectional images were observed in transmission images at an acceleration voltage of 200 kV using an STEM system (HD-2300A) manufactured by the same company, thereby measuring the thickness of each layer. The film thicknesses of the layers other than the first layer can be similarly measured by using the same measurement method.

<First Layer>

The first layer of the infrared detecting device according to this embodiment is formed on the semiconductor substrate and has a first conductivity type (n type, i type, or p type).

Examples of the material of the first layer may include AlAs, GaAs, InAs, AlSb, GaSb, InSb, or InP alone, or a mixed crystal thereof. The first layer may have a structure made of a single material or may have a layered structure made of a plurality of materials.

In terms of obtaining good crystallinity, the lattice constant of the first layer is preferably similar to the lattice constant of the light receiving layer to be described below. Further, in terms of ease of the device formation process, the first layer is preferably made of the same material as the light receiving layer to be described below. Specifically, when the light receiving layer is $Al_xIn_{1-x}Sb$, the first layer is preferably AlInSb.

Further, when the above-described semiconductor substrate is a GaAs substrate, a material of the first layer that is in contact with the GaAs substrate is preferably a layer made of InSb in terms of ensuring good crystallinity.

Further, in terms of ensuring good crystallinity, the first layer preferably includes a dislocation filter layer. Further, the first layer may include a plurality of dislocation filter layers and may include a buffer layer between the dislocation filter layers.

Specifically, the first layer preferably has a layer containing $Al_{a(1)}In_{1-a(1)}Sb$, a layer with a film thickness of $t_{b(1)}$ [nm] containing $Al_{b(1)}In_{1-b(1)}Sb$, and a layer containing $Al_{a(2)}In_{1-a(2)}Sb$ in the order stated, where $t_{b(1)}$, a(1), a(2) and b(1) preferably satisfy the following relations:

$0 < t_{b(1)} \le 2360 \times (b(1)-a(1)) - 240 (0.11 \le b(1)-a(1) \le 0.19)$, $0 < t_{b(1)} \le -1215 \times (b(1)-a(1)) + 427 (0.19 < b(1)-a(1) \le 0.33)$, $0 < t_{b(1)} \le 2360 \times (b(1)-a(2)) - 240 (0.11 \le b(1)-a(2) \le 0.19)$, $0 < t_b(1) \le -1215 \times (b(1)-a(2)) + 427 (0.19 < b(1)-a(2) \le 0.33)$, $0 < a(1) < 0.18$, and $0 < a(2) < 0.18$.

The first layer is preferably n- or p-type doped with a donor impurity or an acceptor impurity, but it may not necessarily be doped as long as it has a first conductivity type. In the case where the first layer is doped, the doping concentration is preferably $1 \times 10^{18}$ [cm$^{-3}$] or more from the viewpoint of reducing the contact resistance with the metal, and it is desirably $1 \times 10^{19}$ [cm$^{-3}$] or less from the viewpoint of securing crystallinity.

The first conductivity type is preferably of n-type conductivity from the viewpoint of improving infrared transmittance by the Burstein-Moss effect of the infrared detecting device.

When the first layer and the light receiving layer are directly in contact with one another, in terms of reducing the diffusion current, the material of the first layer that is in contact with the light receiving layer preferably has a larger band gap than the light receiving layer.

In addition, when the first layer includes a dislocation filter layer, the strain caused inside the light receiving layer due to lattice mismatch between the light receiving layer and "the layer in the first layer that is in contact with the light receiving layer and has a larger band gap than the light receiving layer" is preferably smaller than the strain caused inside the first layer due to lattice mismatch between the dislocation filter layer and the buffer layer.

Specifically, "the layer in the first layer that is in contact with the light receiving layer and has a larger band gap than the light receiving layer" is preferably $Al_pIn_{1-p}Sb$ with a film thickness of $t_p$ [nm], where $|p-x| \times t_p \le |b(1)-a(1)| \times t_{b(1)}$.

Moreover, in terms of securing a sufficiently large band gap, preferably, $p > x + 0.05$.

<Light Receiving Layer>

The light receiving layer in the infrared detecting device according to this embodiment is a layer formed on the first layer. The material of the light receiving layer is a compound semiconductor having a band gap corresponding to infrared rays having a wavelength of 2 μm or more. In one embodiment of the present disclosure, the light receiving layer is $Al_xIn_{1-x}Sb$ that satisfies the relationship: 0.05<x<0.18.

The conductivity type of the light receiving layer may be n, i, or p type. As for doping, the light receiving layer may be undoped (that is, it does not contain impurities), or may be n- or p-type doped with a donor impurity or an acceptor impurity.

In terms of sufficiently absorbing incident infrared rays, the lower limit of the film thickness [nm] of the light receiving layer is preferably 100 nm or more, and more preferably 200 nm or more. Meanwhile, the upper limit of the film thickness of the light receiving layer is preferably 4000 nm or less, and more preferably 3000 nm or less considering increase in the film formation time and ease of the device formation process.

An oxide of Sb would increase the current flowing along the side surfaces of the infrared detecting device and would reduce the resistivity α for the current flowing along the side surfaces of the infrared detecting device. In terms of increasing the resistivity α, the side surfaces of the light receiving layer preferably have no oxide of Sb. Further, Al is preferred because of its cleaning effect in removing oxides; oxides of Al will be formed as a result of removing oxides.

<Second Layer>

The second layer of the infrared detecting device according to this embodiment is a layer that is formed on the light receiving layer and has a second conductivity type (n type, i type, or p type).

The second layer preferably has a conductivity type opposite to that of the first conductivity type of the first layer. For example, when the first layer is of n type, the second layer is preferably of p type. For example, when the first layer is of p type, the second layer is preferably of n type.

As described above, since it is preferable that the first layer be of n type, the second layer is preferably of p type.

The second layer is preferably n- or p-type doped with a donor impurity or an acceptor impurity, but it may not necessarily be doped as long as it has a second conductivity type.

In the case where the second layer is doped, the doping concentration is preferably $1 \times 10^{18}$ [cm$^{-3}$] or more from the viewpoint of reducing the contact resistance with the metal, and it is preferably $1 \times 10^{19}$ [cm$^{-3}$] or less from the viewpoint of securing crystallinity.

Examples of the material of the second layer may include AlAs, GaAs, InAs, AlSb, GaSb, InSb, or InP alone, or a mixed crystal thereof. The second layer may have a structure made of a single material or may have a layered structure made of a plurality of materials.

In terms of obtaining good crystallinity, the lattice constant of the second layer is preferably similar to the lattice constant of the light receiving layer. Further, in terms of ease of the device formation process, the second layer is preferably made of the same material as the light receiving layer to be described below. Specifically, when the light receiving layer is $Al_xIn_{1-x}Sb$, the second layer is preferably $Al_zIn_{1-z}Sb$.

An infrared detecting device according to a second aspect of this embodiment includes: a semiconductor substrate; a first layer having a first conductivity type on the semiconductor substrate; a light receiving layer on the first layer; and a second layer having a second conductivity type on the light receiving layer, wherein a part of the first layer, the light receiving layer, and the second layer form a mesa structure, the second layer contains $Al_zIn_{1-z}Sb$ (0.05<z<0.18), at least a part of the side surfaces and a part of the upper surface of the mesa structure are covered with a protective layer, and a part of the upper surface of the second layer that forms the interface between the second layer and the protective layer has an oxide of Al and has no oxide of Sb.

The state of chemical bonds between the elements in $Al_zIn_{1-z}Sb$ in the vicinity of the interface between the protective layer and the $Al_zIn_{1-z}Sb$ layer can be measured by X-ray photoelectron spectroscopy (XPS).

When the second layer and the light receiving layer are directly in contact with one another, in terms of reducing the diffusion current, the material of the second layer that is in contact with the light receiving layer preferably has a larger band gap than the light receiving layer.

In addition, when the first layer includes a dislocation filter layer, it is preferable that the strain of "the second layer contacting with the light receiving layer and having a larger bandgap than the light receiving layer" caused by lattice mismatch between "the second layer contacting with the light receiving layer and having a larger bandgap than the light receiving layer" and the light receiving layer is smaller than a strain of the dislocation filter layer caused by lattice mismatch between the dislocation filter layer and the buffer layer.

Specifically, "the layer in the second layer that is in contact with the light receiving layer and has a larger band gap than the light receiving layer" is preferably $Al_qIn_{1-q}Sb$ with a film thickness of $t_q$ [nm], where $$|q-x| \times t_q \leq |b(1)-a(1)| \times t_b(1).$$

Moreover, in terms of securing a sufficiently large band gap, preferably, $q > x+0.05$.

From the viewpoint of preventing damage during the device formation process, the lower limit of the film thickness [nm] of the second layer is preferably 30 nm or more, and more preferably 50 nm or more. The upper limit of the film thickness [nm] of the second layer is preferably 2000 nm or less, and more preferably 1000 nm or less considering increase in the film formation time and ease of the device formation process.

<Protective Layer on Side Surfaces>

In the present disclosure, part of the protective layer that is in contact with side surfaces of the light receiving layer is a protective layer made of silicon nitride. The silicon nitride film may be amorphous. The composition ratio of N in the silicon nitride (expressed by: number of N atoms/(number of Si atoms+number of N atoms)) may be higher than 0 and lower than 1. Considering the dangling bonds left in the silicon nitride, the composition ratio is desirably higher than 0.3 and lower than 0.7, more desirably higher than 0.4 and lower than 0.6. The silicon nitride may contain H. In terms of sufficiently protecting the light receiving layer, the film thickness of the silicon nitride is preferably 100 angstroms or more, more preferably 200 angstroms or more, and yet more preferably 300 angstroms or more. In terms of workability, the film thickness is preferably 8000 angstroms or less, more preferably 7000 angstroms or less, and yet more preferably 6000 angstroms or less. As long as the part of the protective layer that is in contact with the side surfaces of the light receiving layer is silicon nitride, a layer having a different composition may be present on the silicon nitride; for example, the protective layer may have silicon oxide on the silicon nitride.

Further, as used herein, the term "protective layer made of silicon nitride" herein indicates that the layer mainly contains Si and N, yet this term also includes cases where the layer contains other elements without departing from the spirit of the present disclosure. Specifically, this term naturally also includes cases where a slight change is made to the composition of this layer without affecting the characteristics (specifically, only if the rate of difference in the SNR as compared with the case of adding no other elements is specifically within a range of 10%), for example, by adding a small amount of other elements (for example, by adding an element such as O or F by not more than several percent).

In embodiments of the present disclosure, each of the compound semiconductor layers (for example, the first layer, the light receiving layer, and the second layer) can be formed by using various film forming methods. For example, preferable methods are molecular beam epitaxy (MBE) and metalorganic vapor phase epitaxy (MOVPE). These methods can be used to form each compound semiconductor layer on the semiconductor substrate. In the step of forming a compound semiconductor layer, the semiconductor substrate may be once taken out from a film forming apparatus to the atmosphere during the formation of layers forming the compound semiconductor layer.

EXAMPLES

The present disclosure will now be described in detail based on examples. However, the present disclosure is not limited to the following examples. It will be appreciated that various modifications may be made without departing from the gist of the present disclosure. The examples are not intended to limit the material, shape, structure, arrangement, dimension, and the like to those described below. In addition, the embodiments of the present disclosure include all of the combinations of characteristic configurations described below. Further, corresponding portions in the drawings are denoted by the same reference numeral, and description common to those portions may not be repeated as appropriate.

Example 1

The following layers were formed on a semi-insulating GaAs substrate (semiconductor substrate 10) in the following order from the semi-insulating GaAs substrate (semiconductor substrate 10) using an MBE system: an n-type InSb layer 21 (an n layer 201 forming a first layer 21) doped with Sn at $7 \times 10^{18}$ [cm$^{-3}$] to a thickness of 0.5 μm; an n-type $Al_{0.07}In_{0.93}Sb$ layer (a buffer layer 202 forming the first layer 21) doped with Sn at $7 \times 10^{18}$ [cm$^{-3}$] to a thickness of 0.5 μm; an n-type $Al_{0.28}In_{0.72}Sb$ layer (a dislocation filter layer 203 forming the first layer 21) doped with Sn at $7\times10^{18}$ [$cm^{-3}$] to a thickness of 0.02 μm; an n-type $Al_{0.07}In_{0.93}Sb$ layer (a buffer layer 204 forming the first layer 21) doped with Sn at $7\times10^{18}$ [$cm^{-3}$] to a thickness of 0.3 μm; an n-type $Al_{0.28}In_{0.72}Sb$ layer (a dislocation filter layer 205 forming the first layer 21) doped with Sn at $7\times10^{18}$ [$cm^{-3}$] to a thickness of 0.02 μm; an n-type $Al_{0.07}In_{0.93}Sb$ layer (a buffer layer 206 forming the first layer 21) doped with Sn at $7\times10^{18}$ [$cm^{-3}$] to a thickness of 0.3 μm; an n-type $Al_{0.26}In_{0.74}Sb$ layer (a barrier layer 207 forming the first layer 21) doped with Sn at $7\times10^{18}$ [$cm^{-3}$] to a thickness of 0.02 μm; an undoped $Al_{0.07}In_{0.93}Sb$ layer (a light receiving layer 22) to a thickness of 1.3 μm; a p-type $Al_{0.26}In_{0.74}Sb$ layer (a barrier layer 209 forming a second layer 23) doped with Zn at $3\times10^{18}$ [$cm^{-3}$] to a thickness of 0.02 μm; a p-type $Al_{0.07}In_{0.93}Sb$ layer (a p layer 210 forming the second layer 23) doped with Zn at $3\times10^{18}$ [$cm^{-3}$] to a thickness of 0.5 μm, thus a compound semiconductor layer 20 was formed (FIG. 1).

Figure 2:
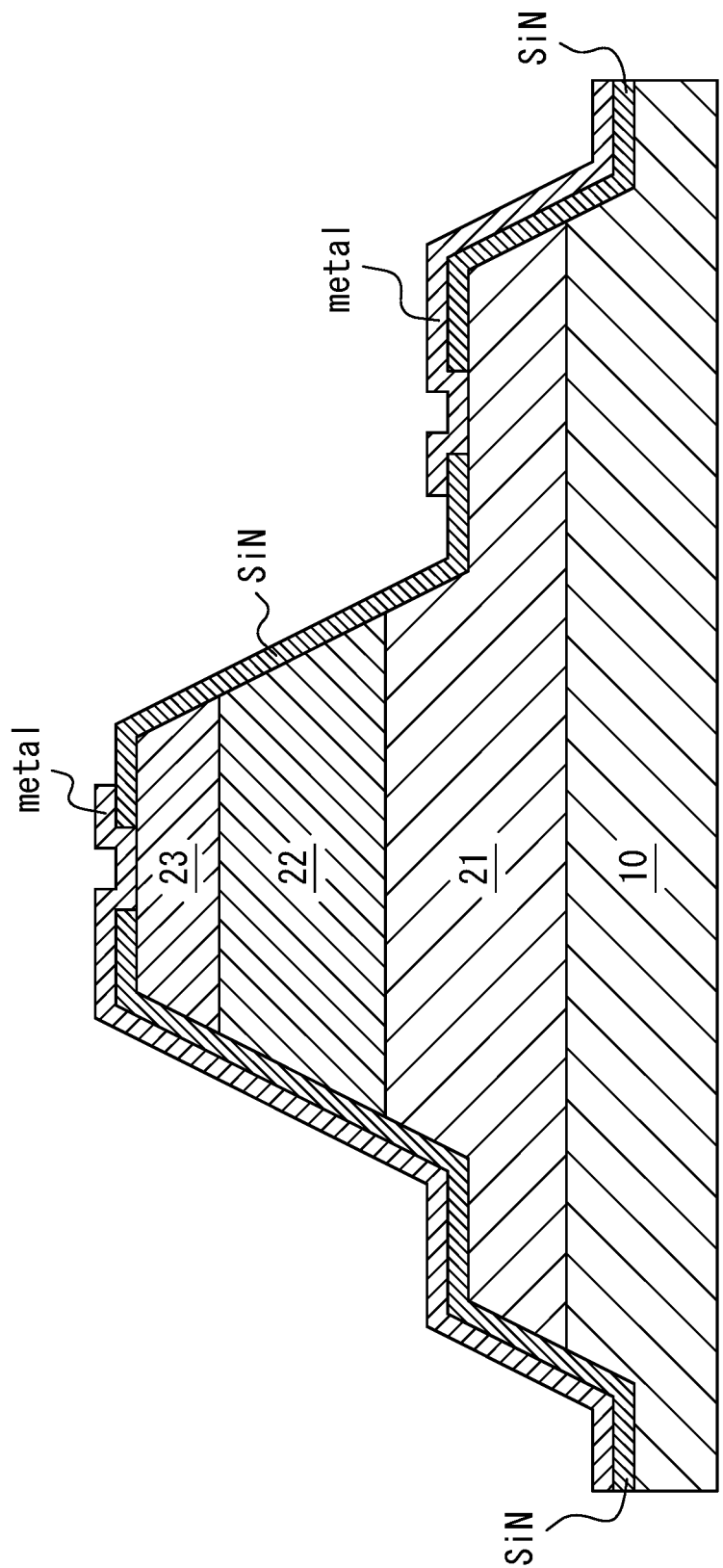
FIG. 2 is a cross-sectional view illustrating an infrared detecting device according to Examples 1 to 3 and Reference Example 1.

Subsequently, a resist pattern was formed on the compound semiconductor layer 20, and etching was performed to fabricate mesa structures. Further, a resist pattern was formed and etching was performed using the resist pattern to form insulating trenches such that detecting devices are electrically independent. Silicon nitride was formed to a thickness of 500 angstroms as a protective layer all over the compound semiconductor layer including the mesa structures and the insulating trenches. Here, mesa side surfaces were covered with silicon nitride. Contact holes were formed in parts of the protective layer, and titanium (Ti), platinum (Pt), and gold (Au) were deposited in the stated order so as to cover the contact holes to form electrode portions, whereby infrared detecting devices in which a plurality of diodes having the mesa structures with the same area and the same perimeter were connected in series were obtained (FIG. 2). Using a similar technique, a plurality of independent infrared detecting devices in which a plurality of diodes that had the mesa structures with the same area and the same perimeter and were connected in series were fabricated so that the area and the perimeter of the mesa structure per infrared detecting device varied.

Example 2, Example 3, Reference Example 1

The Al composition of the light receiving layer 22, the Al compositions of the buffer layers 202, 204, and 206, the Al compositions of the dislocation filter layers 203 and 205, the Al compositions of the barrier layers 207 and 209, and the Al composition of the p layer 210 were changed according to Table 2.

Example 4

Figure 3:
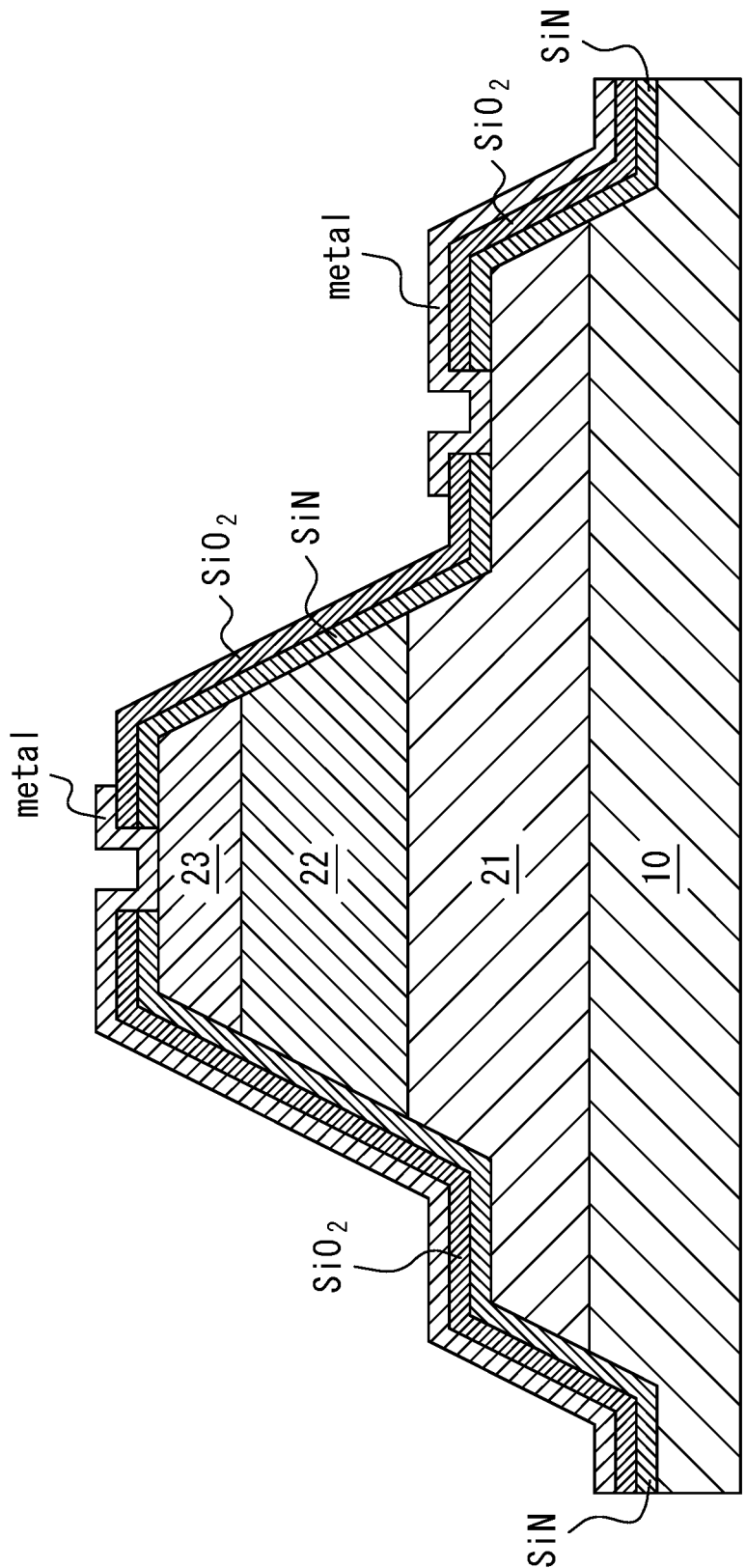
FIG. 3 is a cross-sectional view illustrating an infrared detecting device according to Example 4.

The Al composition of the light receiving layer 22, the Al compositions of the buffer layers 202, 204, and 206, the Al compositions of the dislocation filter layers 203 and 205, the Al compositions of the barrier layers 207 and 209, and the Al composition of the p layer 210 were changed according to Table 2. Further, silicon nitride was formed as a protective layer, followed by the formation of silicon oxide (FIG. 3).

Comparative Example 1

A compound semiconductor layer 20 was formed on a semi-insulating GaAs substrate (semiconductor substrate 10) using an MBE system. The composition, doping concentration, and thickness of each layer were the same as those in Example 1.

Figure 4:
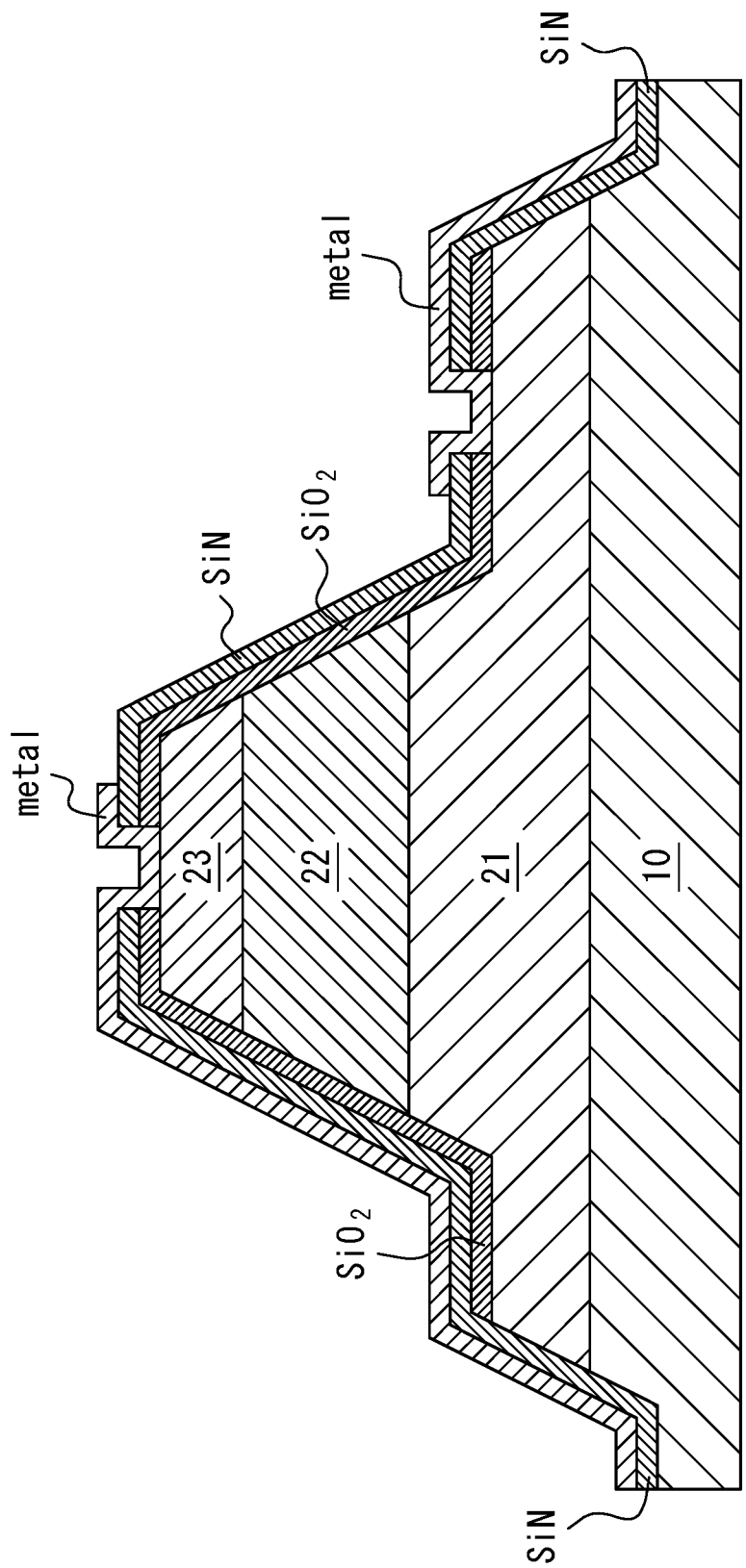
FIG. 4 is a cross-sectional view illustrating an infrared detecting device according to Comparative Examples 1 to 4.

Subsequently, a resist pattern was formed on the compound semiconductor layer 20, and etching was performed to fabricate mesa structures. Next, etching was performed using a hard mask that had been prepared by forming a silicon oxide layer and patterning the silicon oxide layer, thus insulating trenches were formed. Here, mesa side surfaces were covered with silicon oxide. Further, silicon nitride was formed as a protective layer all over the substrate including the mesa structures and the insulating trenches. Contact holes were formed in parts of the protective layer, and titanium (Ti), platinum (Pt), and gold (Au) were deposited in the stated order so as to cover the contact holes to form electrode portions, whereby infrared detecting devices in which a plurality of diodes having the mesa structures with the same area and the same perimeter were connected in series were obtained (FIG. 4). Using a similar technique, a plurality of independent infrared detecting devices in which a plurality of diodes that had the mesa structures with the same area and the same perimeter and were connected in series were fabricated so that the area and the perimeter of the mesa structure per infrared detecting device varied.

Comparative Examples 2 to 4

The Al composition of the light receiving layer 22, the Al compositions of the buffer layers 202, 204, and 206, the Al compositions of the dislocation filter layers 203 and 205, the Al compositions of the barrier layers 207 and 209, and the Al composition of the p layer 210 were changed according to Table 1.

The resistivity α per unit length of the mesa shapes for the current flowing through side surfaces of the infrared detecting devices were compared between the infrared detecting devices formed in Examples 1 to 4, Reference Example 1, and Comparative Example 1 to 4 above. Specifically, for the plurality of infrared detecting devices including the mesa structures having different areas and perimeters, the value of the current flown when a voltage of 5 nV was applied in the forward direction was measured, and the value of the current flown when a voltage of 5 nV was applied in the reverse direction was then measured. It was found that the difference between the absolute values of the current values was no more than 10%. Based on these current values, the device resistance in the forward direction and the device resistance in the reverse direction were determined, and the average of the device resistances was divided by the number of stages of the diodes, thus the device resistance $R_0$ per one stage of diodes was obtained. For the device resistance $R_0$ obtained for each of diodes with different sizes and different perimeters, $1/(R_0 \cdot S)$ was plotted with respect to L/S where S was the mesa area of the corresponding device and L was the perimeter thereof, and α was then determined from the slope. Here, α of the infrared detecting devices formed in Comparative Example 4 was given as 1. Similarly, $1/(R_0 \cdot S)$ was plotted with respect to L/S for Comparative Examples 1 to 4, and the resistivity $R_a$ per unit area of the mesa shapes with respect to the current flowing inside the infrared detecting devices was determined from the intercept. Here, $R_a$ of the infrared detecting devices formed in Comparative Example 4 was given as 1.

<Influence of Increase in Al Composition>

Figure 5:
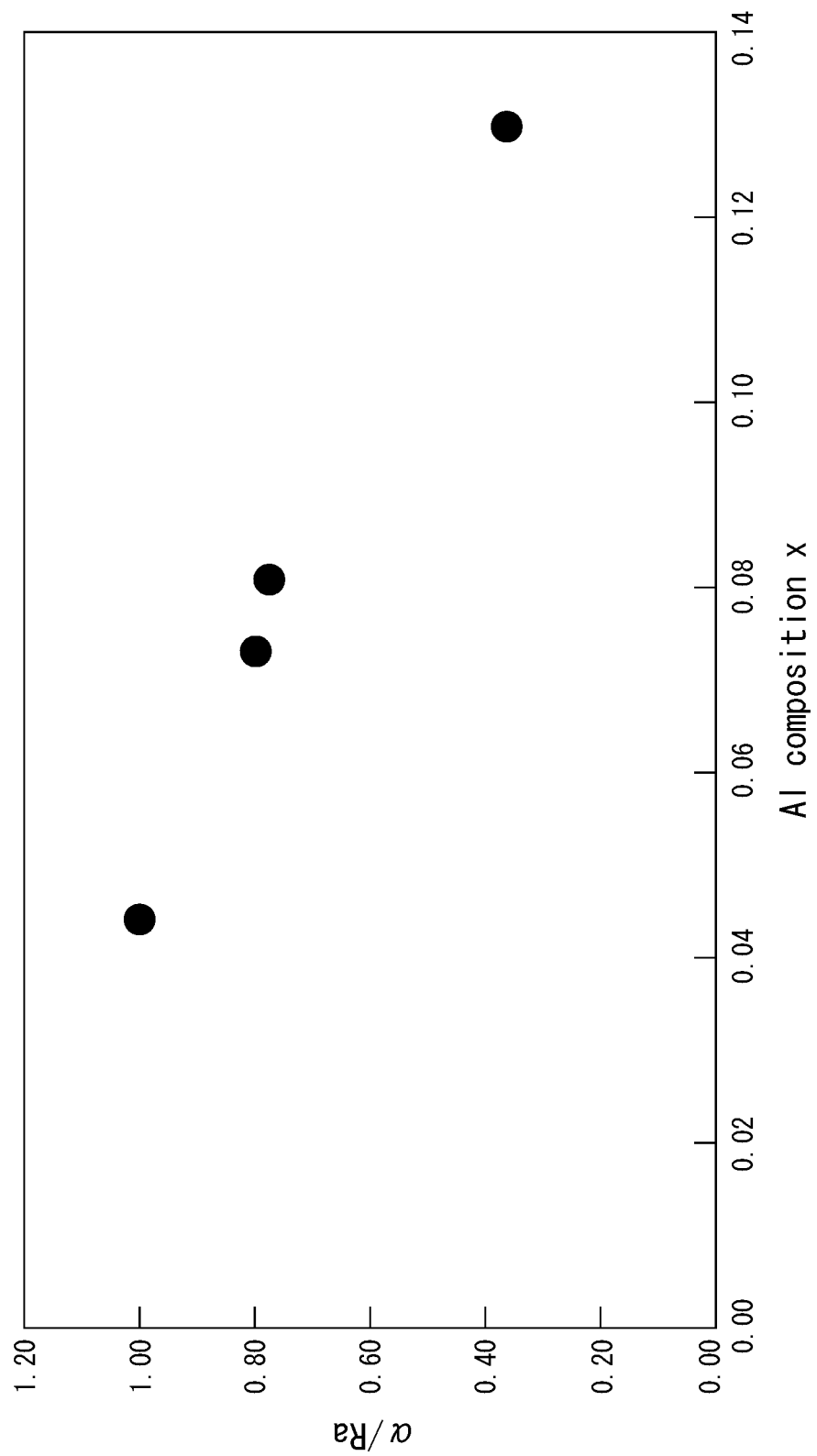
FIG. 5 is a graph illustrating the relationship between $\alpha/R_a$ and the Al composition of a light receiving layer according to Comparative Examples 1 to 4.

Table 1 gives α, $R_a$, and ($\alpha/R_a$) obtained by dividing α by $R_a$ for Comparative Examples 1 to 4. FIG. 5 gives a plot of $\alpha/R_a$ with respect to the Al composition. The magnitude of $\alpha/R_a$ in Comparative Example 4 is given as 1. As given in FIG. 5, as the Al composition increased, $\alpha/R_a$ was found to decrease. As described above, the device resistance $R_0$ of an infrared detecting device is determined such that the lower of the two: the resistance component $R_d$ determined by $R_a$ and the resistance component $R_S$ determined by α is predominant. Accordingly, it was found that as the Al composition increased, it was important to increase α for increasing the device resistance $R_0$.

TABLE 1

| Comparative Examples | Al composition of Buffer layer | Al composition of Dislocation filter layer | Al composition of Barrier layer forming First layer | Al composition of Light receiving layer | Al composition of Barrier layer forming Second layer | Al composition of p layer | Protective layer on mesa side surfaces | Resitivity α (1 in Comparative Example 4) | Resitivity Ra (1 in Comparative Example 4) | α/Ra |
|---|---|---|---|---|---|---|---|---|---|---|
| Comparative Example 1 | 0.07 | 0.28 | 0.26 | 0.07 | 0.26 | 0.07 | Silicon nitride 2000 angstroms on Silicon oxide 3500 angstroms | 1.88 | 2.36 | 0.80 |
| Comparative Example 2 | 0.08 | 0.28 | 0.26 | 0.08 | 0.26 | 0.08 | Silicon nitride 2000 angstroms on Silicon oxide 3500 angstroms | 2.44 | 3.15 | 0.77 |
| Comparative Example 3 | 0.13 | 0.36 | 0.30 | 0.13 | 0.30 | 0.13 | Silicon nitride 2000 angstroms on Silicon oxide 3500 angstroms | 7.62 | 21.08 | 0.36 |
| Comparative Example 4 | 0.04 | 0.24 | 0.19 | 0.04 | 0.19 | 0.04 | Silicon nitride 2000 angstroms on Silicon oxide 3500 angstroms | 1.00 | 1.00 | 1.00 |

Comparison Between Examples and Comparative Examples

Table 2 gives α found for Examples 1 to 4 and Reference Example 1. The magnitude of α in Comparative Example 4 is given as 1. Here, when the Al compositions of the light receiving layers 22 are different, a simple comparison cannot be made because of the difference of the carrier concentrations in the light receiving layers 22; however, since substantially the same compound semiconductor layers 20 were formed on the GaAs substrates in Example 1 and Comparative Example 1, and the Al compositions of the layers including the light receiving layer 22 were the same, α can be compared. When a comparison of α between Example 1 and Comparative Example 1 was made, it was found that α obtained in Example 1 in which the mesa sidewalls were protected by silicon nitride was 2.0 times or more higher than α obtained in Comparative Example 1 in which the mesa sidewalls were protected by silicon oxide.

Figure 6:
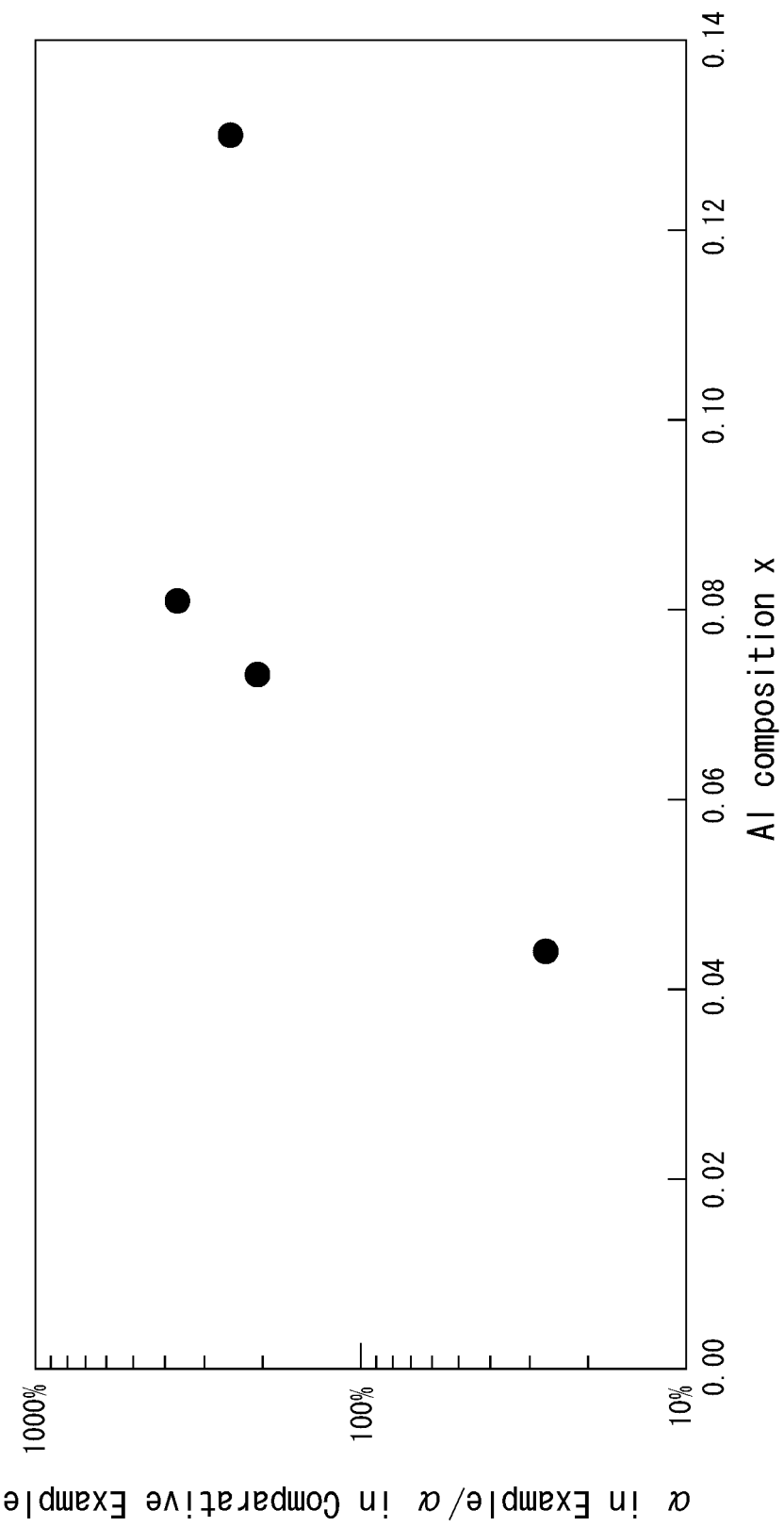
FIG. 6 is a graph illustrating the relationship between the values obtained by dividing α found for Examples 1 to 3 and Reference Example 1 by α found for Comparative Examples 1 to 4, respectively and the Al composition of a light receiving layer.

Similarly, comparisons can be made between Example 2 and Comparative Example 2, between Example 3 and Comparative Example 3, and between Reference Example 1 and Comparative Example 4. Table 2 gives values obtained by dividing α found for Examples and Reference Example by α found for respective Comparative Examples. FIG. 6 gives a plot of values obtained by dividing α found for Examples and Reference Example by α found for respective Comparative Examples with respect to the Al composition. In a region where the Al composition x is lower than 0.05 (a comparison between Reference Example 1 and Comparative Example 4), α was found to be smaller when the mesa sidewalls were protected by silicon nitride than when the mesa sidewalls were protected by silicon oxide. On the other hand, in a region where the Al composition x is higher than 0.05 (comparisons between Examples 1 to 3 and Comparative Examples 1 to 3), it was found that α obtained in Examples in which the mesa sidewalls were protected by silicon nitride was 2.0 times or more higher than α obtained in the respective Comparative Examples in which the mesa sidewalls were protected by silicon oxide.

| Examples/ Reference Example | Al composition of Buffer layer | Al composition of Dislocation filter layer | Al composition of Barrier layer forming First later | Al composition of Light receiving layer | Al composition of Barrier layer forming Second layer | Al composition of p layer | Protective layer on mesa side surfaces | Resistivity α (1 in) Comparative Example 4 | α in Example/ α in Comparative Example (Comparative Example used for comparison) |
|---|---|---|---|---|---|---|---|---|---|
| Example 1 | 0.07 | 0.28 | 0.26 | 0.07 | 0.26 | 0.07 | Silicon nitride 500 angstroms | 3.9 | 207% (Comparative Example 1) |
| Example 2 | 0.08 | 0.28 | 0.26 | 0.08 | 0.26 | 0.08 | Silicon nitride 500 angstroms | 8.9 | 365% (Comparative Example 2) |
| Example 3 | 0.13 | 0.36 | 0.30 | 0.13 | 0.30 | 0.13 | Silicon nitride 500 angstroms | 19.2 | 251% (Comparative Example 3) |
| Reference Example 1 | 0.04 | 0.24 | 0.19 | 0.04 | 0.19 | 0.04 | Silicon nitride 500 angstroms | 0.3 | 27% (Comparative Example 4) |
| Example 4 | 0.08 | 0.28 | 0.26 | 0.08 | 0.26 | 0.08 | Silicon oxide 3500 angstroms on Silicon nitride 100 angstroms | 6.6 | 272% (Comparative Example 2) |

Here, for a region where the Al composition x is even higher, particularly in a region where the Al composition x is higher than 0.18, good crystallinity is hardly obtained due to the high Al composition, thus it is difficult to obtain sufficiently high α irrespective of whether the mesa sidewalls are protected by silicon oxide or the mesa sidewalls are protected by silicon nitride.

In Example 4, a compound semiconductor layer 20 was formed to have the same Al composition as that in Example 2, the thickness of silicon nitride of a protective layer was 100 angstroms, and silicon oxide was formed to 3500 angstroms on the protective layer. Part of the protective layer that was directly in contact with the side surfaces of the light receiving layer 22 was made of silicon nitride. When compared with Comparative Example 2 in which part of the protective layer that was directly in contact with the side surfaces of the light receiving layer 22 was made of silicon oxide, α obtained in Example 4 was found to be 2.0 times or more higher. This demonstrated that as long as part of the protective layer that is directly in contact with the mesa side surfaces is made of silicon nitride, 2.0 times or more higher α can be obtained even when the protective layer has silicon oxide.

(XPS Spectra from Interface)

X-ray photoelectron spectroscopy was performed on devices obtained in Example 3 and Comparative Example 3 to determine the state of chemical bonds between the elements in $Al_zIn_{1-z}Sb$ in the vicinity of the interface between the protective layer and an $Al_zIn_{1-z}Sb$ layer corresponding to the p layer 210 included in the second layer 23.

(Method of Analyzing the State of Chemical Bonds at Interface)

For the analysis, PHI5000 VersaProbe II manufactured by ULVAC-PHI, Inc. was used. This is a technique in which when a solid surface is irradiated with an X-ray beam, photoelectrons emitted from atoms in the vicinity of a sample surface out of inner shells due to the photoelectric effect are subjected to energy analysis to detect electrons thereby analyzing the elemental composition and the state of chemical bonds in the vicinity of the surface.

XPS can usually find information on a region of a depth up to several nanometers from the surface. An XPS analysis can be performed after thinning a protective layer of a sample by sputtering using an Ar ion gun to a thickness such that photoelectrons from an $Al_zIn_{1-z}Sb$ layer can be detected.

Specifically, sputtering was performed with settings: an accelerating voltage of an Ar ion beam at 500 V and an ion beam raster scan range of 2 mm×2 mm. The analysis was performed at an angle of incidence of the ion beam at 45° measured from the normal line of the sample. A monochromatic AlKα X-ray source was used as an X-ray source, and the power of X-ray was set to 50 W at 15 kV. In the analysis, a neutralizer gun for reducing charge accumulation in the sample was used at the same time.

In order to monitor the film thickness of the protective layer left, after performing sputtering for a certain time period, XPS depth profiling was performed by repeating cycles of measuring Si2p and In4d spectra by XPS. At the point where the Si2p peak intensity of the semiconductor was reduced from the maximum value of 87% to approximately 81%, sputtering was terminated. The film thickness of the protective layer left at that point was assumed to be 4 nm to 5 nm.

For comparison, for the devices of Example 3, the protective layer was completely removed by Ar sputtering and further sputtering was performed, and $Al_zIn_{1-z}Sb$ in a position sufficiently distant from the interface was then subjected to the same analysis.

Figure 7:
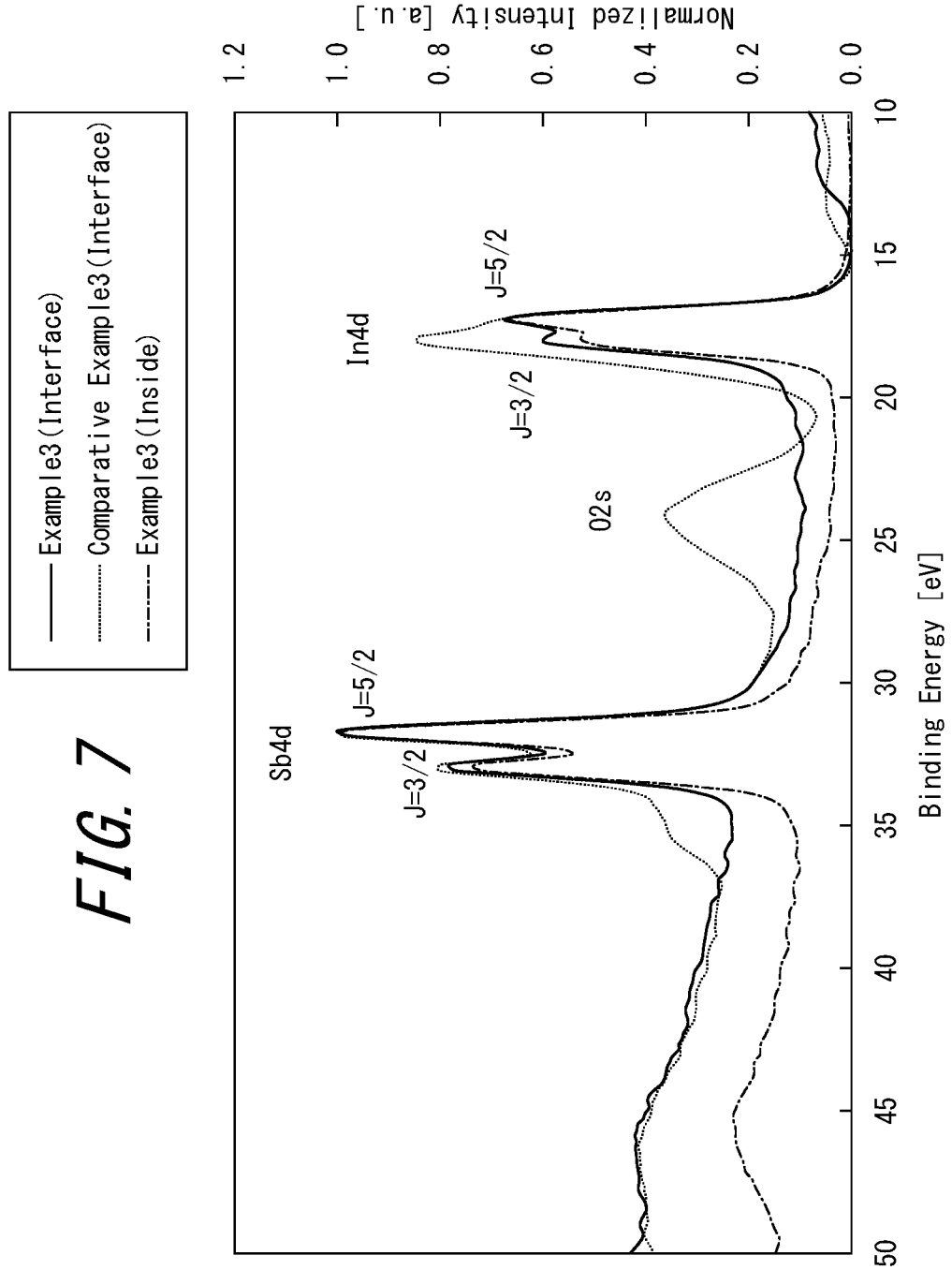
FIG. 7 is a diagram illustrating the relationship between binding energy and photoelectron intensity.
Figure 8:
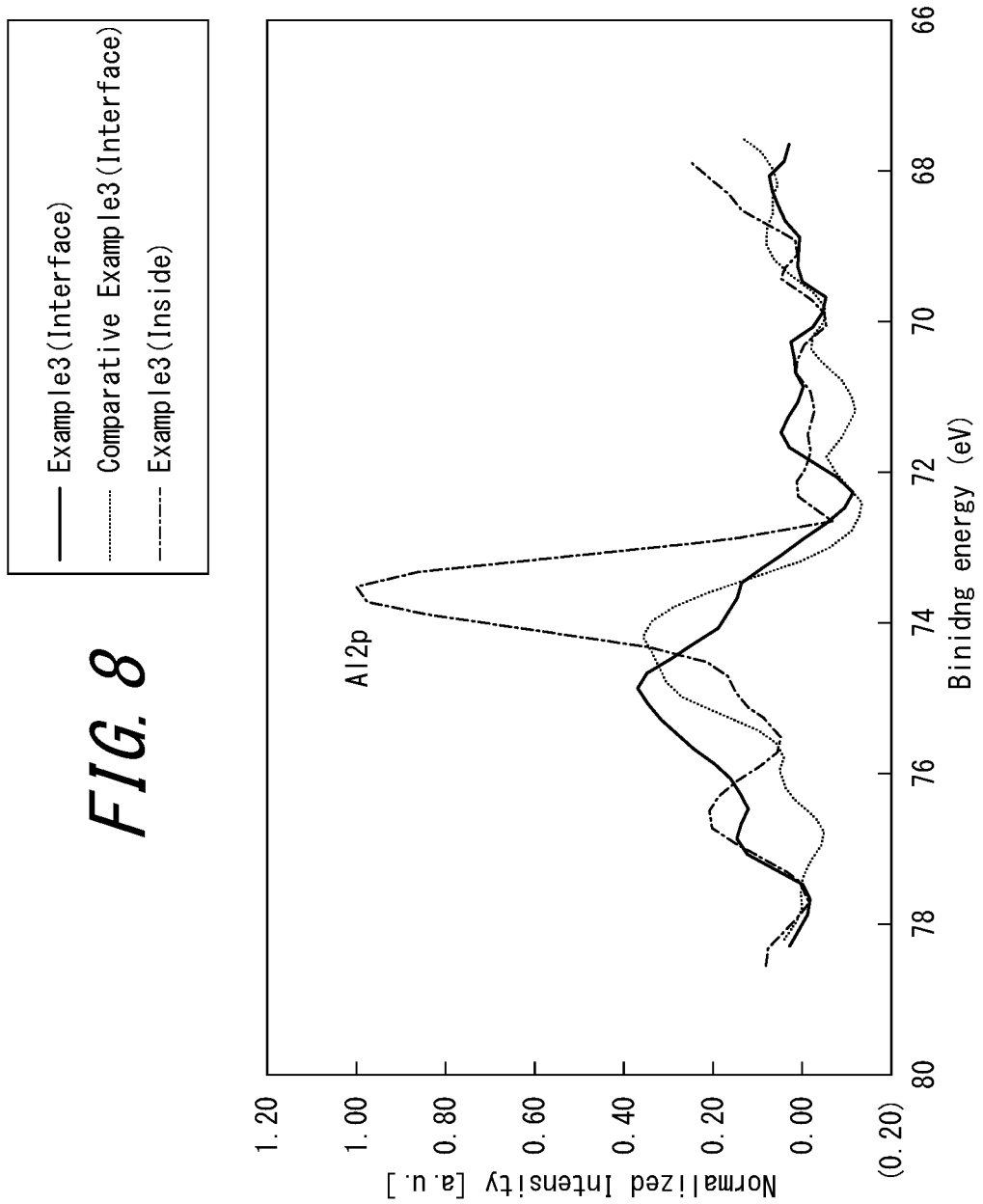
FIG. 8 is a diagram illustrating the relationship between binding energy and photoelectron intensity.

FIG. 7 gives the measured photoelectron spectra of the In4d and Sb4d regions. FIG. 8 gives the photoelectron spectrum of an Al2p region. The horizontal axis represents the binding energy. The vertical axis represents the photoelectron intensity normalized by the maximum value. In the measurement area in FIG. 7, an In4d photoelectron peak (separated into an In4d peak of J=5/2 and an In4d peak of J=3/2) was observed around 17 eV; and an O2s photoelectron peak was observed around 24 eV, and a Sb4d photoelectron peak (separated into a Sb4d peak of J=5/2 and a Sb4d peak of J=3/2) was observed around 32 eV.

Typically, these peak positions indicate the peak positions of the state of chemical bonds in $Al_zIn_{1-z}Sb$.

In the XPS measurements, the energies of the measured spectra were different from one another due to charge accumulation in the samples; to address this, the binding energies of the spectra in FIG. 7 and FIG. 8 were corrected so that the position of the Sb4d peak of J=5/2 would lie at 31.8 eV.

As given in FIG. 7, photoelectron peak positions of In and Sb in $Al_zIn_{1-z}Sb$ in the vicinity of the interface with the protective layer in Example 3 were almost the same as the positions of the 4d photoelectron peaks of In and Sb in $Al_zIn_{1-z}Sb$ in a position sufficiently distant from the interface in Example 3. $Al_zIn_{1-z}Sb$ in the position sufficiently distant from the interface is presumed not to have been oxidized because it is not affected by the device formation process including the protective layer formation and etching; accordingly, In and Sb in $Al_zIn_{1-z}Sb$ in the vicinity of the interface in Example 3 were probably also not oxidized.

On the other hand, the Sb4d peak in $Al_zIn_{1-z}Sb$ in the vicinity of the interface with the protective layer in Comparative Example 3 was observed on the high energy side unlike the Sd4d peak in $Al_zIn_{1-z}Sb$ in a position sufficiently distant from the interface in Example 3.

Specifically, when the area under the straight line connecting the two points at 29 eV and 40 eV where no peak was observed was regarded as the background, a Sb4d peak of J=5/2 around 32 eV and a Sb4d peak of J=3/2 around 33 eV were observed, and at the same time, a peak with an intensity that was 10% or more higher than the intensity of the Sb4d peak of J=5/2 around 35 eV was observed. This suggests that Sb in $Al_zIn_{1-z}Sb$ in the vicinity of the interface in Comparative Example 3 was oxidized.

Here, Sb was regarded as being oxidized when "the position of the photoelectron peak of Sb in $Al_zIn_{1-z}Sb$ in the vicinity of the interface was on the high energy side that was 1 eV or more higher than the energy of the position of the Sb4d peak of J=3/2 for $Al_zIn_{1-z}Sb$ in the position sufficiently distant from the interface".

The same was true for In, and the In4d peak in $Al_zIn_{1-z}Sb$ in the vicinity of the interface with the protective layer was observed on the high energy side unlike the In4d peak in $Al_zIn_{1-z}Sb$ in a position sufficiently distant from the interface in Example 3. Indium in $Al_zIn_{1-z}Sb$ in the vicinity of the interface in Comparative Example 3 is considered to have been oxidized.

As seen in FIG. 8, the Al2p peak in $Al_zIn_{1-z}Sb$ in the vicinity of the interface in Example 3 was observed on the high energy side (75 eV) unlike the Al2p peak (around 73 eV) in $Al_zIn_{1-z}Sb$ in a position sufficiently distant from the interface in Example 3.

This suggests that Al in $Al_zIn_{1-z}Sb$ in the vicinity of the interface in Example 3 was oxidized. Here, Al was regarded as being oxidized when "the position of the Al2p peak in $Al_zIn_{1-z}Sb$ in the vicinity of the interface was on the high energy side that was 1 eV or more higher than the energy of the position of the Al2p peak in $Al_zIn_{1-z}Sb$ in the position sufficiently distant from the interface".

On the other hand, the Al2p peak in $Al_zIn_{1-z}Sb$ in the vicinity of the interface in Comparative Example 3 was observed on the high energy side (around 74 eV) unlike the Al2p peak (around 73 eV) in $Al_zIn_{1-z}Sb$ in a position sufficiently distant from the interface in Example 3. This suggests that Al in $Al_zIn_{1-z}Sb$ in the vicinity of the interface in Comparative Example 3 was slightly oxidized.

Thus, a part of the upper surface of the $Al_zIn_{1-z}Sb$ layer in the p layer 210 that formed the interface between the p layer and the protective layer in Example 3 is considered to have had an oxide of Al and no oxide of Sb.

Here, the above-described interface portion of the $Al_zIn_{1-z}Sb$ layer in the p layer 210 with the protective layer and the interface portion of the $Al_xIn_{1-x}Sb$ layer in the light receiving layer 22 with the protective layer had the same or similar layer structures and underwent the same or similar production processes; accordingly, although they were different in that the former formed a surface parallel to the substrate and the latter was on the side surfaces, it will be understood that they would exhibit the same or similar states of chemical bonds. Thus, sufficiently high α is considered to have been obtained due to the suppression of the formation of Sb oxide on the side surfaces of the light receiving layer by the formation of Al oxide.

(Appendix)

[1] An infrared detecting device comprising:
a semiconductor substrate;
a first layer having a first conductivity type on the semiconductor substrate;
a light receiving layer on the first layer; and
a second layer having a second conductivity type on the light receiving layer,
wherein the second layer contains $Al_zIn_{1-z}Sb$ (0.05<z<0.18),
the side surfaces and an upper surface of the mesa structure are covered with the protective layer, and
a part of an upper surface of the second layer that forms an interface between the second layer and the protective layer has an oxide of Al and has no oxide of Sb.

[2] The infrared detecting device according to [1] above, wherein the light receiving layer contains $Al_xIn_{1-x}Sb$ (0.06<x<0.16).

[3] The infrared detecting device according to [1] above, wherein a layer that is included in the second layer and is in contact with the light receiving layer is made of a material having a band gap larger than a band gap of the light receiving layer.

[4] The infrared detecting device according to [1] above, wherein a material of a layer that is included in the second layer and is in contact with the light receiving layer is $Al_yIn_{1-y}Sb$ (0.10<y−x<0.40).

[5] The infrared detecting device according to [1] above, wherein the semiconductor substrate is a GaAs substrate, and
a material of a layer that is included in the first layer and is in contact with the GaAs substrate is InSb.

[6] The infrared detecting device according to [1] above, wherein the first layer has a layer containing $Al_{a(1)}In_{1-a(1)}Sb$, a layer with a film thickness of $t_{b(1)}$ [nm] containing $Al_{b(1)}In_{1-b(1)}Sb$, and a layer containing $Al_{a(2)}In_{1-a(2)}Sb$ in order stated, where $t_{b(1)}$, a(1), a(2) and b(1) satisfy the following relations:

$0<t_{b(1)} \leq 2360 \times (b(1)-a(1))-240 (0.11 \leq b(1)-a(1) \leq 0.19)$, $0<t_b(1) \leq -1215 \times (b(1)-a(1))+427 (0.19<b(1)-a(1) \leq 0.33)$, $0<t_{b(1)} \leq 2360 \times (b(1)-a(2))-240 (0.11 \leq b(1)-a(2) \leq 0.19)$, $0<t_b(1) \leq -1215 \times (b(1)-a(2))+427 (0.19<b(1)-a(2) \leq 0.33)$, $0<a(1)<0.18$, and $0<a(2)<0.18$.

[7] The infrared detecting device according to [6] above, wherein a layer that is included in the first layer and is in contact with the light receiving layer is $Al_pIn_{1-p}Sb$ with a film thickness of $t_p$ [nm],
where $|p-x| \times t_p \leq |b(1)-a(1)| \times t_{b(1)}$, and
$p>x+0.05$.

[8] The infrared detecting device according to [6] above, wherein the layer that is included in the second layer and is in contact with the light receiving layer is $Al_qIn_{1-q}Sb$ with a film thickness of $t_q$ [nm],
where $|q-x| \times t_q \leq |b(1)-a(1)| \times t_{b(1)}$, and
$q>x+0.05$.

The invention claimed is:

1. An infrared detecting device comprising:
a semiconductor substrate;
a first layer having a first conductivity type on the semiconductor substrate;
a light receiving layer on the first layer; and
a second layer having a second conductivity type on the light receiving layer,
wherein a part of the first layer, the light receiving layer, and the second layer form a mesa structure,
the second layer contains $Al_zIn_{1-z}Sb$ (0.05<z<0.18),
the side surfaces and an upper surface of the mesa structure are covered with the protective layer,
a part of an upper surface of the second layer that forms an interface between the second layer and the protective layer has an oxide layer made of a constituent material of the second layer, and
the oxide layer includes an oxide of Al and has no oxide of Sb.

2. The infrared detecting device according to claim 1, wherein the light receiving layer contains $Al_xIn_{1-x}Sb$ (0.05<x<0.18).

3. The infrared detecting device according to claim 1, wherein a layer that is included in the second layer and is in contact with the light receiving layer is made of a material having a band gap larger than a band gap of the light receiving layer.

4. The infrared detecting device according to claim 1, wherein a material of a layer that is included in the second layer and is in contact with the light receiving layer is $Al_yIn_{1-y}Sb$ (0.10<y−x<0.40).

5. The infrared detecting device according to claim 1, wherein the semiconductor substrate is a GaAs substrate, and
a material of a layer that is included in the first layer and is in contact with the GaAs substrate is InSb.

6. The infrared detecting device according to claim 1, wherein the first layer has a layer containing $Al_{a(1)}In_{1-a(1)}Sb$, a layer with a film thickness of $t_{b(1)}$ [nm] containing $Al_{b(1)}In_{1-b(1)}Sb$, and a layer containing $Al_{a(2)}In_{1-a(2)}Sb$ in order stated,
where $t_{b(1)}$, $a(1)$, $a(2)$ and $b(1)$ satisfy the following relations:

$0 < t_{b(1)} \leq 2360 \times (b(1)-a(1)) - 240 (0.11 \leq b(1)-a(1) \leq 0.19)$, $0 < t_b(1) \leq -1215 \times (b(1)-a(1)) + 427 (0.19 < b(1)-a(1) \leq 0.33)$, $0 < t_{b(1)} \leq 2360 \times (b(1)-a(2)) - 240 (0.11 \leq b(1)-a(2) \leq 0.19)$, $0 < t_b(1) \leq -1215 \times (b(1)-a(2)) + 427 (0.19 < b(1)-a(2) \leq 0.33)$, $0 < a(1) < 0.18$, and $0 < a(2) < 0.18$.

7. The infrared detecting device according to claim 6, wherein a layer that is included in the first layer and is in contact with the light receiving layer is $Al_p In_{1-p}Sb$ with a film thickness of $t_p$ [nm],
where $|p-x| \times t_p \leq |b(1)-a(1)| \times t_{b(1)}$, and
$p > x+0.05$.

8. The infrared detecting device according to claim 6, wherein the layer that is included in the second layer and is in contact with the light receiving layer is $Al_q In_{1-q}Sb$ with a film thickness of $t_q$ [nm],
where $|q-x| \times t_q \leq |b(1)-a(1)| \times t_{b(1)}$, and
$q > x+0.05$.

* * * * *